(12) United States Patent
Bauer

(10) Patent No.: US 9,793,447 B2
(45) Date of Patent: Oct. 17, 2017

(54) OPTOELECTRONIC SEMICONDUCTOR CHIP AND OPTOELECTRONIC SEMICONDUCTOR COMPONENT

(71) Applicant: OSRAM Opto Semiconductors GmbH, Regensburg (DE)

(72) Inventor: Adam Bauer, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/778,556

(22) PCT Filed: Mar. 28, 2014

(86) PCT No.: PCT/EP2014/056261
§ 371 (c)(1),
(2) Date: Sep. 18, 2015

(87) PCT Pub. No.: WO2014/173623
PCT Pub. Date: Oct. 30, 2014

(65) Prior Publication Data
US 2016/0276552 A1   Sep. 22, 2016

(30) Foreign Application Priority Data

Apr. 24, 2013   (DE) ........................ 10 2013 104 132

(51) Int. Cl.
| | |
|---|---|
| *H01L 29/18* | (2006.01) |
| *H01L 33/00* | (2010.01) |
| *H01L 33/50* | (2010.01) |
| *H01L 25/075* | (2006.01) |
| *H01L 33/20* | (2010.01) |

(Continued)

(52) U.S. Cl.
CPC ........ *H01L 33/505* (2013.01); *H01L 25/0753* (2013.01); *H01L 33/20* (2013.01); *H01L 33/38* (2013.01); *H01L 33/382* (2013.01); *H01L 33/62* (2013.01); *H01L 2924/0002* (2013.01)

(58) Field of Classification Search
CPC ...................................................... H01L 33/38
USPC .......................................................... 257/88
See application file for complete search history.

(56) References Cited

U.S. PATENT DOCUMENTS

| | | | |
|---|---|---|---|
| 6,163,036 A | 12/2000 | Taninaka et al. | |
| 6,307,218 B1 * | 10/2001 | Steigerwald | H01L 33/38 257/94 |
| 8,017,966 B2 | 9/2011 | Ishida et al. | |

(Continued)

FOREIGN PATENT DOCUMENTS

| | | |
|---|---|---|
| CN | 102015961 A | 4/2011 |
| CN | 102176502 A | 9/2011 |

(Continued)

*Primary Examiner* — Asok K Sarkar
*Assistant Examiner* — Igwe U Anya
(74) *Attorney, Agent, or Firm* — Slater Matsil, LLP

(57) ABSTRACT

An optoelectronic semiconductor chip has a non-rectangular, parallelogram-shaped top surface and an active zone, which is at a distance from the top surface and runs parallel to the top surface at least in places. The top surface includes a radiation exit surface, through which electromagnetic radiation generated during operation in the active zone emerges. The radiation exit surface has at least four vertices. The top surface includes at least one triangular connection area via which the active zone is electrically connectable.

16 Claims, 8 Drawing Sheets

(51) Int. Cl.
*H01L 33/38* (2010.01)
*H01L 33/62* (2010.01)

(56) References Cited

U.S. PATENT DOCUMENTS

| | | | |
|---|---|---|---|
| 8,450,751 B2 | 5/2013 | Engl et al. | |
| 8,459,840 B2 | 6/2013 | Ishimori et al. | |
| 8,492,776 B2 | 7/2013 | Nagai | |
| 8,500,315 B2 | 8/2013 | Tokida et al. | |
| 8,956,887 B2 | 2/2015 | Sorimachi | |
| 2003/0137031 A1 | 7/2003 | Young et al. | |
| 2005/0127374 A1 | 6/2005 | Lin et al. | |
| 2006/0231852 A1 | 10/2006 | Kususe et al. | |
| 2007/0158804 A1* | 7/2007 | Hosoya | H01L 24/24 257/684 |
| 2010/0102336 A1 | 4/2010 | Lee et al. | |
| 2010/0171135 A1* | 7/2010 | Engl | H01L 33/382 257/98 |
| 2011/0079795 A1 | 4/2011 | Nagai | |
| 2011/0284822 A1* | 11/2011 | Jung | H01L 33/505 257/13 |
| 2012/0086028 A1* | 4/2012 | Beeson | H01L 33/501 257/98 |
| 2012/0234375 A1* | 9/2012 | Nakamura | H01L 31/0463 136/249 |
| 2013/0056757 A1* | 3/2013 | Miyachi | H01L 27/153 257/88 |
| 2013/0221392 A1 | 8/2013 | Engl et al. | |
| 2013/0320384 A1* | 12/2013 | Liepold | B32B 18/00 257/98 |
| 2013/0329440 A1 | 12/2013 | Tsutsumi et al. | |
| 2016/0276552 A1 | 9/2016 | Bauer | |

FOREIGN PATENT DOCUMENTS

| | | |
|---|---|---|
| DE | 19953160 A1 | 5/2000 |
| DE | 102007022947 A1 | 10/2008 |
| DE | 102008005497 A1 | 7/2009 |
| JP | 2000164930 A | 6/2000 |
| JP | 2003023178 A | 1/2003 |
| JP | 2008041626 A | 2/2008 |
| JP | 2008123837 A | 5/2008 |
| JP | 2008524831 A | 7/2008 |
| JP | 2010525585 A | 7/2010 |
| JP | 2010287777 A | 12/2010 |
| JP | 2011249573 A | 12/2011 |
| JP | 2012169189 A | 9/2012 |
| JP | 2013055187 A | 3/2013 |
| JP | WO2013005646 A1 | 2/2015 |
| WO | 2006068297 A1 | 6/2006 |
| WO | 2014173623 A1 | 10/2014 |

* cited by examiner

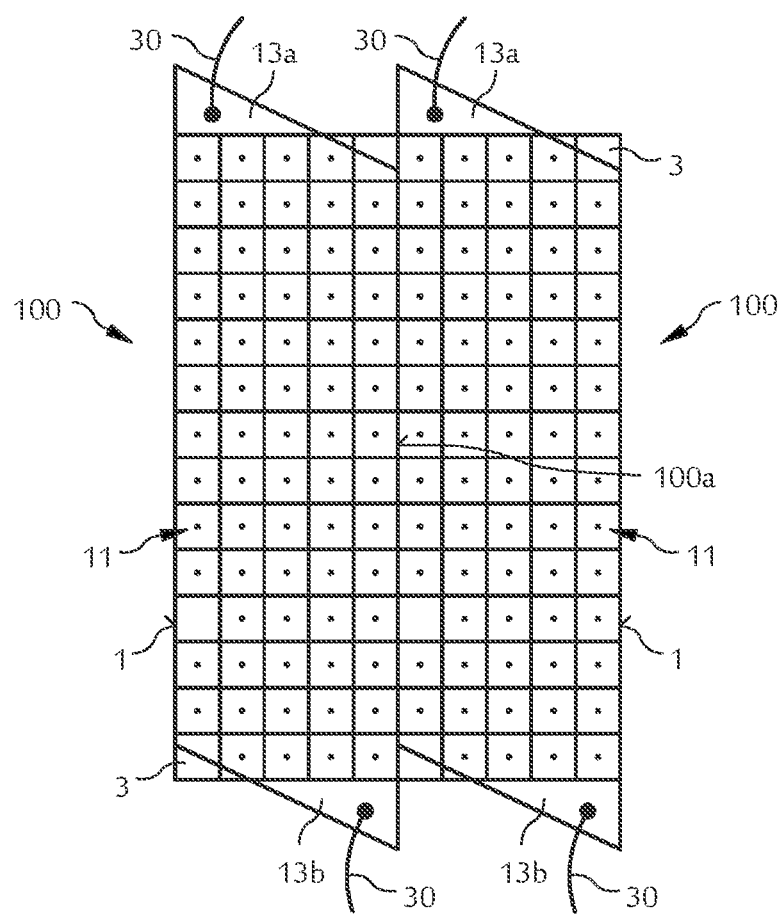

OPTOELECTRONIC SEMICONDUCTOR CHIP AND OPTOELECTRONIC SEMICONDUCTOR COMPONENT

This patent application is a national phase filing under section 371 of PCT/EP2014/056261, filed Mar. 28, 2014, which claims the priority of German patent application 10 2013 104 132.9, filed Apr. 24, 2013, each of which is incorporated herein by reference in its entirety.

TECHNICAL FIELD

An optoelectronic semiconductor chip is specified. Furthermore, an optoelectronic semiconductor component is specified.

BACKGROUND

U.S. Pat. No. 6,163,036 describes an optoelectronic semiconductor chip and an optoelectronic semiconductor component.

SUMMARY

Embodiments of the invention specify an optoelectronic semiconductor chip in which a radiation exit surface can be made particularly large. Further embodiments specify an optoelectronic semiconductor component which can be produced particularly simply and cost-effectively.

In accordance with at least one embodiment of the optoelectronic semiconductor chip, the optoelectronic semiconductor chip comprises a non-rectangular, parallelogram-shaped top surface. The top surface is parallelogram-shaped within the scope of the production tolerance. That is to say that the top surface has in each case two boundary lines that are parallel to one another within the scope of the production tolerance. The boundary lines here are arranged parallel to one another with a tolerance of +/−5%.

The top surface is formed by a main surface of the optoelectronic semiconductor chip.

The top surface faces away from a bottom surface of the optoelectronic semiconductor chip. At the bottom surface, the optoelectronic semiconductor chip can be provided, for example, for mounting on a carrier.

The top surface is formed, for example, at the top side of the optoelectronic semiconductor chip and comprises the entire top side of the optoelectronic semiconductor chip. Besides the non-rectangular, parallelogram-shaped top surface, the optoelectronic semiconductor chip can also have a non-rectangular, parallelogram-shaped cross-sectional surface and a non-rectangular, parallelogram-shaped bottom surface. The cross-sectional surface and the bottom surface can run parallel to the top surface within the scope of the production tolerance.

In accordance with at least one embodiment of the optoelectronic semiconductor chip, the optoelectronic semiconductor chip comprises an active zone. The active zone is provided for generating electromagnetic radiation, for example, light, during the operation of the optoelectronic semiconductor chip. The active zone is arranged at a distance from the top surface in the interior of the optoelectronic semiconductor chip and runs parallel to the top surface at least in places within the scope of the production tolerance.

In accordance with at least one embodiment of the optoelectronic semiconductor chip, the top surface comprises a radiation exit surface, through which electromagnetic radiation generated during operation in the active zone emerges. That is to say that the radiation exit surface is formed by a part of the top surface. The radiation exit surface is, for example, the sole radiation exit surface of the optoelectronic semiconductor chip. Through side surfaces of the optoelectronic semiconductor chip, in this case hardly any or no electromagnetic radiation at all generated in the active zone emerges from the semiconductor chip.

In accordance with at least one embodiment of the optoelectronic semiconductor chip, the radiation exit surface has at least four vertices. The radiation exit surface can be embodied in a rectangular fashion, for example. Furthermore, it is possible for the radiation exit surface to be formed by a polygon, for example, a pentagon or hexagon.

In accordance with at least one embodiment of the optoelectronic semiconductor chip, the top surface comprises at least one triangular connection area. In this case, the connection area is embodied in a triangular fashion within the scope of the production tolerance. The connection area is an electrical connection area of the optoelectronic semiconductor chip, via which the active zone is electrically connectable. The connection area can be covered in places or completely by an electrically conductive material, for example, a metallization.

In accordance with at least one embodiment of the optoelectronic semiconductor chip, the optoelectronic semiconductor chip comprises a non-rectangular, parallelogram-shaped top surface and an active zone, which is arranged at a distance from the top surface and runs parallel to the top surface at least in places. In this case, the top surface comprises a radiation exit surface, through which electromagnetic radiation generated during operation in the active zone emerges, wherein the radiation exit surface has at least four vertices. Furthermore, the top surface comprises at least one triangular connection area via which the active zone is electrically connectable.

An optoelectronic semiconductor chip described here is based on the insight, inter alia, that at the ends of a non-rectangular, parallelogram-shaped semiconductor chip having a non-rectangular, parallelogram-shaped top surface, an electrical connection area can be embodied in a particularly space-saving manner.

Furthermore, it is possible for optoelectronic semiconductor chips described here to be produced in production by singulation trenches running along straight lines. The singulation trenches can be sawing trenches, for example. A semiconductor wafer having a multiplicity of the optoelectronic semiconductor chips is singulated by means of the singulation trenches to form the optoelectronic semiconductor chips. In this case, the main extension directions of singulation trenches running in different directions are not perpendicular to one another, but rather run transversely with respect to one another, thus resulting in semiconductor chips having parallelogram-shaped, non-rectangular top surfaces.

Furthermore, it is possible in this way to realize an optoelectronic semiconductor chip having a rectangular or almost rectangular radiation exit surface, without the connection area of the optoelectronic semiconductor chip having to extend over the entire width or the entire length of the top surface of the optoelectronic semiconductor chip. That is to say that an optoelectronic semiconductor chip having a non-rectangular, parallelogram-shaped top surface makes it possible to provide a homogeneous luminous image by means of an almost rectangular overall luminous image in conjunction with an areally smaller contact area in comparison with conventional, rectangular optoelectronic semiconductor chips. In the case of the optoelectronic semiconductor chip described here, the radiation exit surface can be chosen to be particularly large in relation to the connection area.

Here and hereinafter, even if this is not explicitly mentioned, geometrical terms such as "parallel", "triangle", "rectangle" should not be understood in the strictly mathematical sense, but rather these terms relate to possible configuration within the scope of the production tolerance.

In accordance with at least one embodiment of the optoelectronic semiconductor chip, the top surface exclusively comprises the radiation exit surface and the at least one triangular connection area. That is to say that the top surface is formed exclusively with these components which together completely fill the top surface.

In accordance with at least one embodiment of the optoelectronic semiconductor chip, the top surface comprises exactly one radiation exit surface and exactly two triangular connection areas, which are arranged at mutually opposite sides of the top surface. In this case, the radiation exit surface is arranged between the two triangular connection areas. In this case, the top surface consists of the radiation exit surface and the two triangular connection areas. The parallelogram-shaped top surface is therefore subdivided into two triangles and, for example, one rectangle or one hexagon. In this way, it is possible in a particularly simple manner to provide an optoelectronic semiconductor chip comprising a radiation exit surface, wherein the connection areas are arranged in the vertices of the parallelogram-shaped top surface. The area proportion of the top surface that is occupied by the connection areas can be set in a simple manner by means of the angle by which the parallelogram is tilted.

In accordance with at least one embodiment of the optoelectronic semiconductor chip, the radiation exit surface is rectangular. This can be achieved, for example, by the top surface being divided into exactly one rectangular radiation exit surface and two triangular connection areas. The triangular connection areas are then arranged at two opposite sides of the rectangular radiation exit surface.

In accordance with at least one embodiment of the optoelectronic semiconductor chip, the radiation exit surface is hexagonal. That is to say that the radiation exit surface has six vertices. In this case, the triangular connection areas are made particularly small in terms of their area and comprise, for example, only the vertex tips of the parallelogram-shaped top surface. In this way, the remaining radiation exit surface is made particularly large and nevertheless virtually rectangular, such that the semiconductor chip can be used with high efficiency in applications in which, for example, square radiation exit surfaces are not desired.

In accordance with at least one embodiment of the optoelectronic semiconductor chip, the optoelectronic semiconductor chip comprises at least one plated-through hole which penetrates through the active zone, wherein the plated-through hole is electrically conductively connected to the at least one triangular connection area. In this case, the optoelectronic semiconductor chip at the radiation exit surface has no conductor tracks or contact tracks used for distributing a current for operating the optoelectronic semiconductor chip, rather the distribution of the current over the chip area takes place below the radiation exit surface. Such optoelectronic semiconductor chips which comprise a plated-through hole through the active zone are described in principle and for rectangular semiconductor chips in the document U.S. Patent Publication No. 2010/0171135 (application Ser. No. 12/596,170, now U.S. Pat. No. 8,450,751), the disclosure content of which is hereby expressly incorporated by reference.

In accordance with at least one embodiment of the optoelectronic semiconductor chip, the at least one triangular connection area is wire-bondable. That is to say that the triangular connection areas of the optoelectronic semiconductor chip are provided for wire bonding.

An optoelectronic semiconductor component is furthermore specified. The optoelectronic semiconductor component comprises at least one optoelectronic semiconductor chip as described here. That is to say that all features disclosed for the optoelectronic semiconductor chip are also disclosed for the optoelectronic semiconductor component.

In accordance with at least one embodiment of the optoelectronic semiconductor component, the optoelectronic semiconductor component comprises at least one optoelectronic semiconductor chip as described here. The optoelectronic semiconductor component can in this case comprise exactly one such optoelectronic semiconductor chip, or two or more of such optoelectronic semiconductor chips.

In accordance with at least one embodiment of the optoelectronic semiconductor chip, the optoelectronic semiconductor component comprises a conversion element. The conversion element is, for example, a foil or a rigid plate which contains a luminescence conversion material.

The conversion material is provided for absorbing part of the electromagnetic radiation generated in the active zone and for re-emitting electromagnetic radiation having, for example, a longer wavelength. The conversion element therefore wavelength-converts the radiation.

If the optoelectronic semiconductor chip generates blue light in its active zone, for example, then the conversion element can be provided for absorbing part of the blue light and emitting light having a higher wavelength. In this way, the semiconductor component can emit white mixed light, for example, which is composed of the light emitted directly by the optoelectronic semiconductor chip and the converted light. Furthermore, it is possible for the conversion element to absorb virtually the entire radiation from the optoelectronic semiconductor chip that penetrates into the conversion element, and for the semiconductor component thus to emit colored light.

In accordance with at least one embodiment of the optoelectronic semiconductor component, the conversion element is arranged at the radiation exit surface of the at least one optoelectronic semiconductor chip. In this case, the conversion element can be applied directly to the radiation exit surface of the optoelectronic semiconductor chip. Furthermore, it is possible for the conversion element to be connected to the radiation exit surface of the at least one optoelectronic semiconductor chip via a connecting means, such as a radiation-transmissive adhesive, for example.

In accordance with at least one embodiment of the optoelectronic semiconductor component, the conversion element is rectangular within the scope of the production tolerance. That is to say that the conversion element is free of cutouts or recesses, thereby ensuring that the conversion element does not cover the connection area or the connection areas of the optoelectronic semiconductor chip. Rather, the conversion element is embodied, for example, as a rectangular lamella or rectangular foil.

In this case, the optoelectronic semiconductor component is based on the concept, inter alia, that in conventional optoelectronic semiconductor components which do not comprise optoelectronic semiconductor chips having a non-rectangular, parallelogram-shaped top surface, recesses for keeping the connection areas free have to be provided in a conversion element. The recesses are produced, for example, by stamping or sawing-out from the conversion element. The costs for producing the optoelectronic semiconductor component can now be reduced since only unstructured rectangular conversion elements are required for the optoelectronic semiconductor component described here.

In accordance with at least one embodiment of the optoelectronic semiconductor component, the conversion element completely covers the radiation exit surface of the at least one optoelectronic semiconductor chip. That is to say that the radiation exit surface of the at least one optoelectronic semiconductor chip is completely covered by the conversion element, which does not necessarily mean that the conversion element is in direct contact with the radiation exit surface. In this case, however, there are no parts of the radiation exit surface above which part of the conversion element is not arranged.

In accordance with at least one embodiment of the optoelectronic semiconductor component, the conversion element projects beyond a side surface of the optoelectronic semiconductor chip in places. This is the case, for example, if the radiation exit surface of the optoelectronic semiconductor chip is not embodied in rectangular fashion, but rather in hexagonal fashion, for example. In this case, adjacent to the triangular connection area, there is a small region of the conversion element which is not disposed directly downstream of the radiation exit surface, but rather projects beyond a side surface of the optoelectronic semiconductor chip and is therefore not illuminated directly by the radiation exit surface. As a result of light being guided in the conversion element, however, it is nevertheless possible for electromagnetic radiation generated in the active zone also to enter in this region of the conversion element and, therefore, for electromagnetic radiation also to be emitted from this region of the conversion element. The luminous area of the optoelectronic semiconductor component is increased in this way and is larger than the radiation exit surface.

Furthermore, in an optoelectronic semiconductor component described here, two or more optoelectronic semiconductor chips which are covered by a single conversion element at their radiation exit surfaces can be combined in order to form large homogeneous luminous areas.

In accordance with at least one embodiment of the optoelectronic semiconductor component, the conversion element completely covers the radiation exit surfaces of at least two optoelectronic semiconductor chips. For this purpose, on account of the fact that the connection areas of the optoelectronic semiconductor chips are embodied in a triangular fashion and are arranged in the vertices of the parallelogram-shaped top surface, it is possible to use a rectangular conversion element which completely covers a plurality of radiation exit surfaces.

In accordance with at least one embodiment of the optoelectronic semiconductor component, the optoelectronic semiconductor component comprises two optoelectronic semiconductor chips, each having exactly one triangular connection area, wherein the two optoelectronic semiconductor chips adjoin one another at their side surfaces respectively facing away from the triangular connection areas, and the conversion element completely covers the radiation exit surfaces of both optoelectronic semiconductor chips.

In this case, two non-rectangular radiation exit surfaces of the two optoelectronic semiconductor chips are used to fashion a rectangular radiation exit surface covered with an unstructured rectangular conversion element that is free of cutouts for connection areas of the optoelectronic semiconductor chips.

BRIEF DESCRIPTION OF THE DRAWINGS

The optoelectronic semiconductor chips described here and the optoelectronic semiconductor components described here are explained in greater detail below on the basis of exemplary embodiments and the associated figures.

In conjunction with the schematic illustrations in FIGS. 1A, 1B, 1C, 2A, 2B, 2C, 2D, 3A, 3B, 3C, 3D, exemplary embodiments of optoelectronic semiconductor chips described here are explained in greater detail.

Figure 4A:
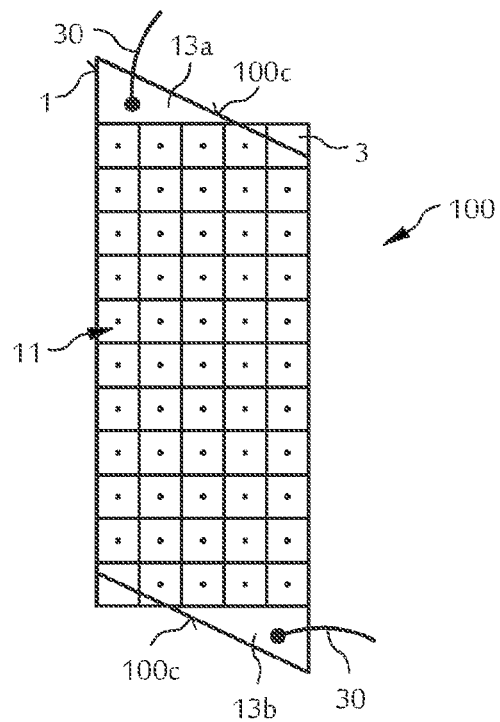
Figure 4B:
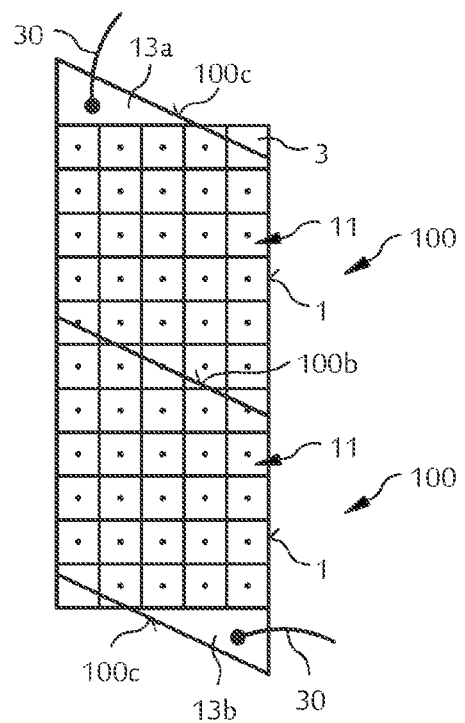

In conjunction with the schematic illustrations in FIGS. 4A, 4B, 5, exemplary embodiments of optoelectronic semiconductor components described here are explained in greater detail.

Figure 6A:
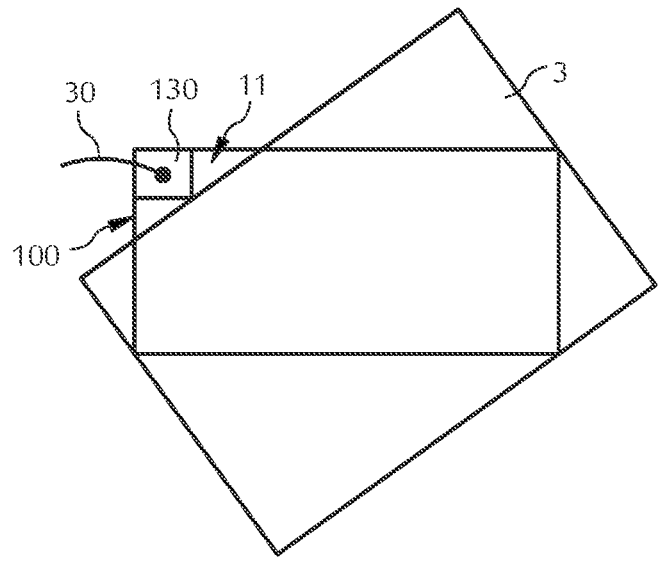
Figure 6B:
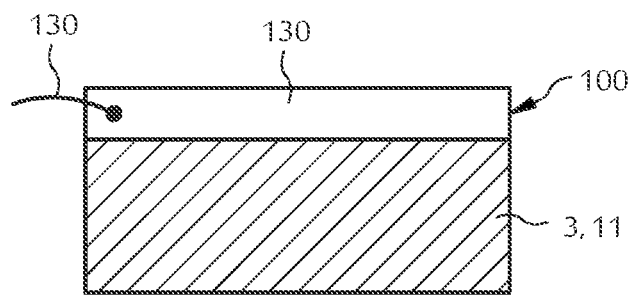
Figure 6C:
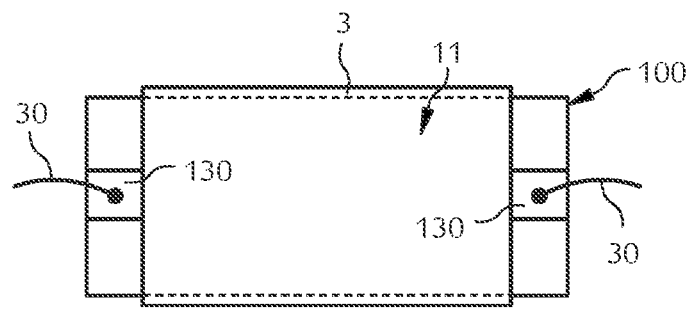

With reference to FIGS. 6A, 6B, 6C, an optoelectronic semiconductor component described here is explained in greater detail.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1A:
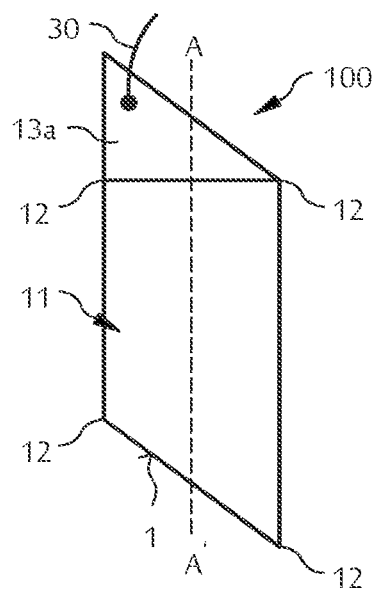

In conjunction with FIG. 1A, a first exemplary embodiment of an optoelectronic semiconductor chip described here is explained in greater detail. FIG. 1A shows a schematic plan view of the optoelectronic semiconductor chip 100. The optoelectronic semiconductor chip 100 comprises a non-rectangular, parallelogram-shaped top surface 1. The top surface 1 is subdivided into the quadrilateral radiation exit surface 11 and the triangular connection area 13a.

Electromagnetic radiation generated in the optoelectronic semiconductor chip 100 during operation emerges through the radiation exit surface 11. In the exemplary embodiment in FIG. 1A, the radiation exit surface 11 has four vertices 12. It directly adjoins the triangular connection area 13a.

The triangular connection area 13a is suitable for wire bonding. Via the triangular connection area 13a, the optoelectronic semiconductor chip 100 can be supplied with the electric current required for operation via the contact wire 30.

Figure 1B:
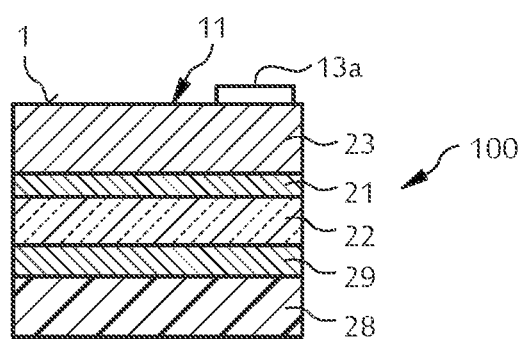

FIG. 1B shows, in a schematic sectional illustration, one possible section through the optoelectronic semiconductor chip 100 along the sectional line AA'. The optoelectronic semiconductor chip in this example is a thin-film chip that is free of a growth substrate. The optoelectronic semiconductor chip 100 comprises a p-conducting region 22, an n-conducting region 23 and the active zone 21 therebetween. In the active zone 21, the electromagnetic radiation is generated during the operation of the semiconductor chip 100, the radiation then emerging at least partly through the radiation exit surface 11.

The top surface 1 comprises the radiation exit surface 11 and the triangular connection area 13a, which in the present case is embodied as a bonding pad, for example, and via which contact can be made with the optoelectronic semiconductor chip 100 on the n-side. The mirror layer 29 is arranged at the underside of the optoelectronic semiconductor chip 100 facing away from the top surface 1, which mirror layer can be formed, for example, with a reflective metal such as silver. The carrier 28 can succeed the mirror layer 29 at the side facing away from the active zone 21, which carrier is formed with an electrically conductive material, for example, and via which carrier contact can be made with the optoelectronic semiconductor chip 100 on the p-side.

Figure 1C:
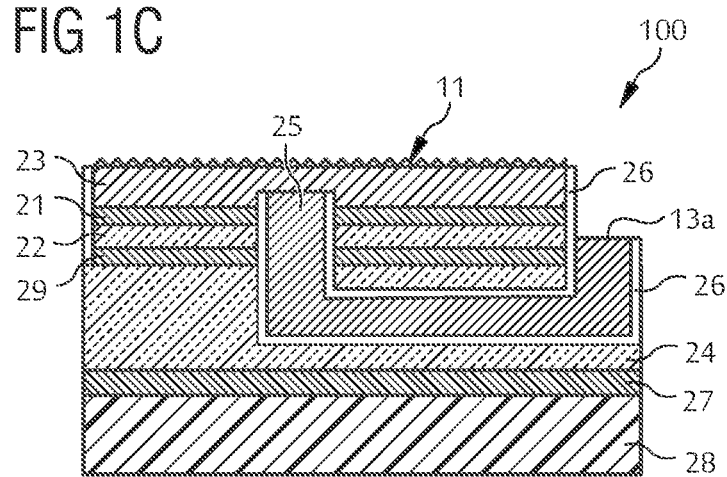

As an alternative to the exemplary embodiment described in conjunction with FIG. 1B, the optoelectronic semiconductor chip can also be embodied as shown in FIG. 1C. In this case, the triangular connection area 13a is not arranged on the n-conducting region of the optoelectronic semiconductor chip 100, but rather alongside the semiconductor layers 22, 23, 24.

In this case, the optoelectronic semiconductor chip 100 comprises a plated-through hole 25 which penetrates through the active zone 21 and which produces an electrically conductive connection between the n-conducting region 23 and the triangular connection area 13a. The optoelectronic semiconductor chip once again comprises the active zone 21, the p-conducting region 22 and the n-conducting region 23.

As is shown in FIG. 1C, the radiation exit surface 11 can be roughened, for example, thereby increasing the probability of light emergence. The optoelectronic semiconductor chip can comprise a passivation 26 at least at its side flanks. The optoelectronic semiconductor chip can furthermore comprise the mirror 29, which is arranged between the p-conducting region 22 and a p-type connection material 24. The carrier 28 can be fixed at the underside of the optoelectronic semiconductor chip 100 via the connecting means 27, for example, a solder material.

In the case of the optoelectronic semiconductor chip in FIG. 1C, it is possible for the radiation exit surface 11 to be free of electrically conductive structures, such as conductor tracks, for example, which distribute an electric current from the triangular connection area 13a over the radiation exit surface 11. However, in the exemplary embodiment in FIG. 1C, the current impressed on the n-side is distributed below the radiation exit surface 11 via the at least one plated-through hole 25.

Figure 2A:
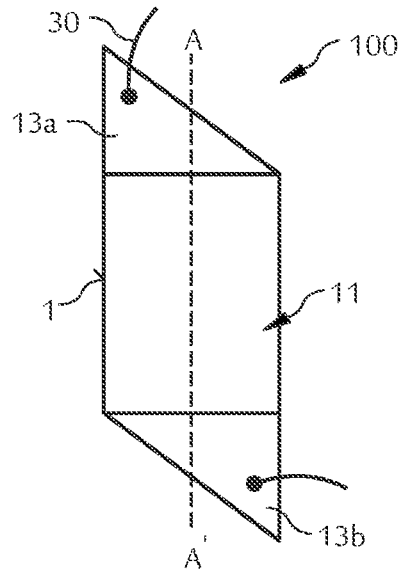

In conjunction with FIG. 2A, a further exemplary embodiment of an optoelectronic semiconductor chip described here is explained in greater detail. In this exemplary embodiment, the top surface 11 is composed of two triangular connection areas 13a, 13b and a rectangular radiation exit surface 11.

Figure 2B:
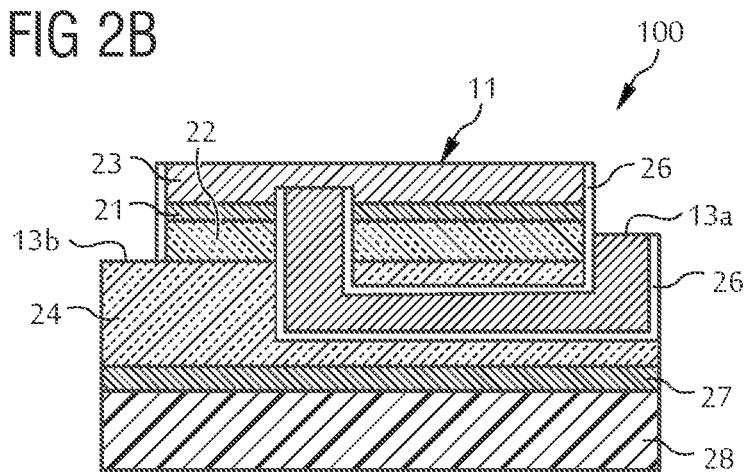

One possible realization of the optoelectronic semiconductor chip can be implemented as shown in FIG. 2B. The sectional illustration in FIG. 2B along the sectional line AA' shows an optoelectronic semiconductor chip comprising a p-conducting region 22, an n-conducting region 23 and an active zone 21. The semiconductor chip 100 furthermore comprises a p-type connection material 24, a connecting means 27 and a carrier 28, which is embodied in an electrically insulating fashion, for example. Contact is made with the optoelectronic semiconductor chip 100 via the triangular connection areas 13a, 13b, wherein contact is made with the optoelectronic semiconductor chip on the p-side via the connection area 13b. Both triangular connection areas 13a, 13b can be wire-bondable and are then electrically contact-connected via contact wires 30.

Figure 2C:
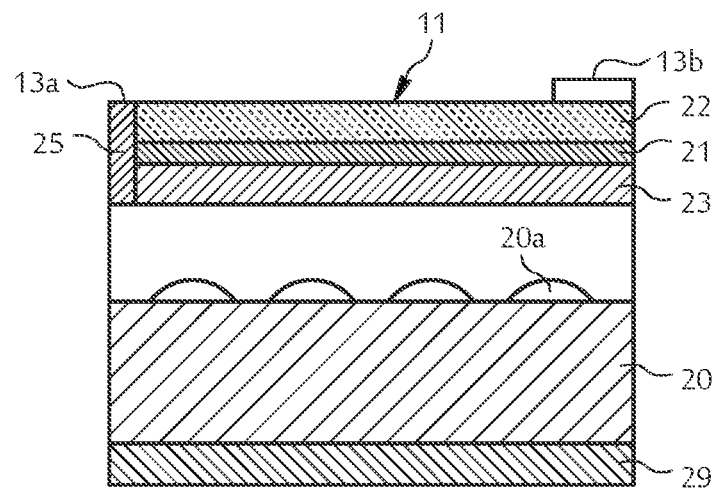

The schematic sectional illustration in FIG. 2C shows a further possible realization of the optoelectronic semiconductor chip along the sectional line AA'. The optoelectronic semiconductor chip comprises a p-conducting region 22, an n-conducting region 23 and an active zone 21. These regions are grown epitaxially onto the growth substrate 20, which is embodied in an electrically insulating fashion, for example. The growth substrate 20 is a substrate composed of sapphire, for example. A structuring 20a can be present at the top side of the growth substrate 20 facing the active zone 21, which structuring can contribute to improvement in the coupling out of light and/or to an improved growth of the subsequent layers.

The triangular connection areas 13a, 13b are electrically conductively connected to the associated regions of the semiconductor chip. By way of example, the triangular connection area 13a is connected to the n-conducting region 23 via a plated-through hole 25.

The mirror 29 is arranged at the underside of the growth substrate 20 facing away from the active zone 21, which mirror can be embodied as a metal mirror and/or as a dielectric mirror and/or as a Bragg mirror.

Figure 2D:
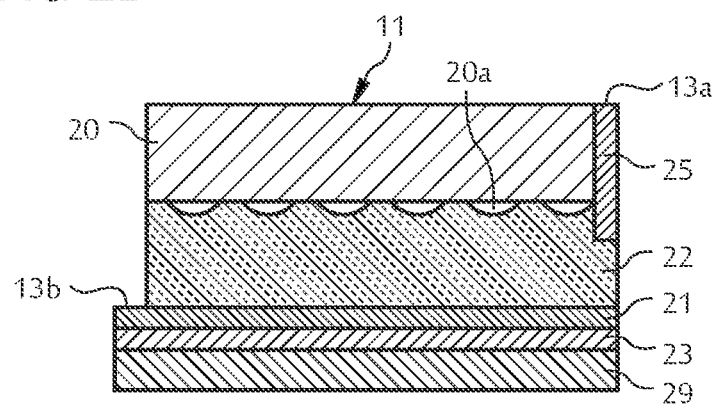

The schematic sectional illustration in FIG. 2D shows a further possible realization of the optoelectronic semiconductor chip along the sectional line AA'. In contrast to the exemplary embodiment in FIG. 2C, electromagnetic radiation emerges through the growth substrate 20 in this exemplary embodiment. The mirror 29 is arranged at that side of the p-conducting region 22 which faces away from the growth substrate 20.

Figure 3A:
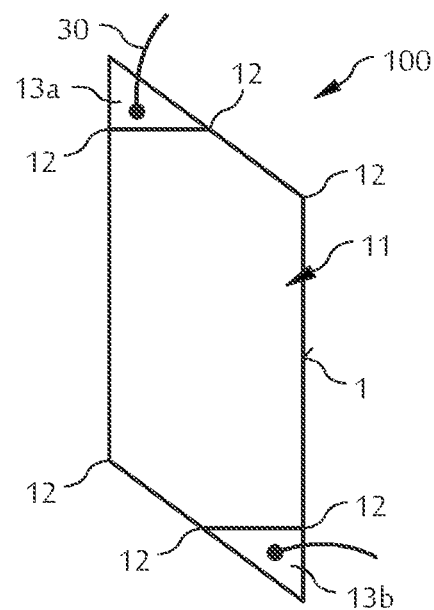
Figure 3B:
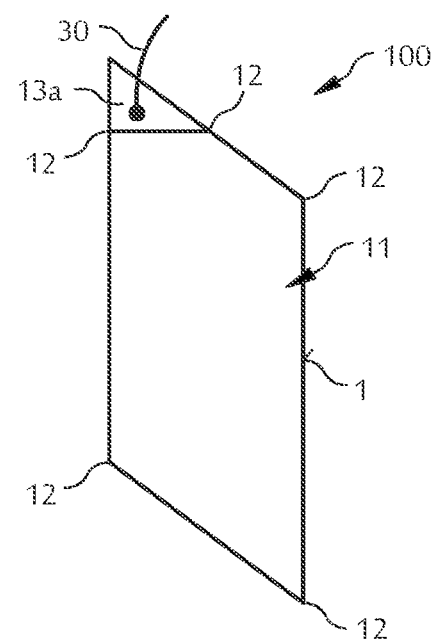

In conjunction with FIGS. 3A and 3B, with the aid of schematic plan views, further exemplary embodiments of optoelectronic semiconductor chips described here are explained in greater detail. In this case, the optoelectronic semiconductor chips can be constructed as described in conjunction with FIGS. 1B, 1C, 2B.

In the case of the exemplary embodiment in FIG. 3A, the radiation exit surface 11 of the semiconductor chip 100 is embodied in a hexagonal fashion. As a result, the triangular connection regions 13a, 13b can be formed by regions of smaller area than is the case for the exemplary embodiment in FIG. 2A, for example.

In the exemplary embodiment in FIG. 3B, the radiation exit surface 11 is formed by a pentagon, wherein the optoelectronic semiconductor chip has only a single triangular connection area 13a, which is embodied as wire-bondable. The second electrical connection can be formed, for example, by the underside of a carrier 28 as is illustrated in FIG. 1B.

Figure 3C:
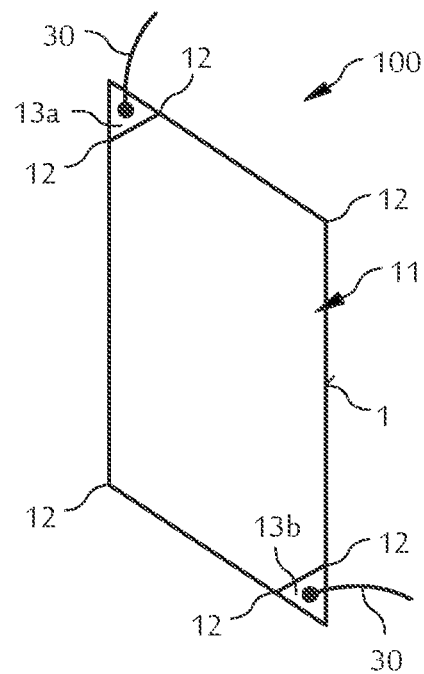

In the exemplary embodiment in FIG. 3C, the radiation exit surface 11 is formed by a hexagon. In this exemplary embodiment, the triangular connection areas 13a, 13b are made particularly small with regard to their area. The connection areas 13a, 13b merely comprise the outermost vertex tips of the top surface and, in contrast to the exemplary embodiments described above, are not embodied as right-angled triangles.

Figure 3D:
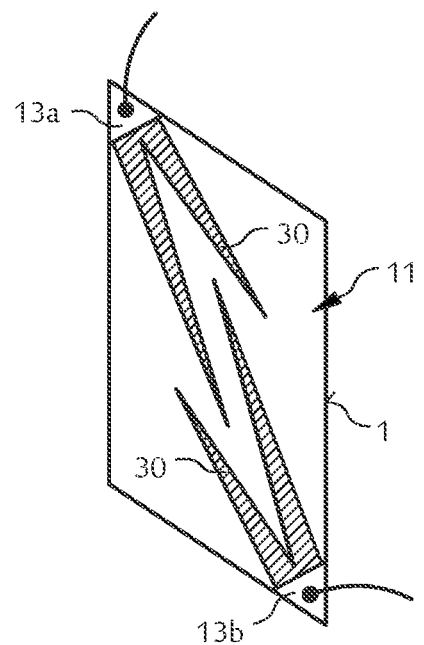

In the case of the exemplary embodiment in FIG. 3D current distribution tracks 30 extend from each of the triangular connection areas 13a, 13b over the radiation exit surface 11. Such current distribution tracks 30 can also be present in other exemplary embodiments of the semiconductor chip 100 described here. The current distribution tracks 30 are electrically conductively connected to an assigned connection area 13a, 13b. By means of the current distribution tracks 30, current impressed via the connection areas can be distributed particularly uniformly over the radiation exit surface 11 and thus particularly uniformly over the active zone 21. The current distribution tracks 30 can be formed with a metal and/or with a transparent conductive oxide.

In conjunction with FIG. 4A, with the aid of a schematic plan view, a first exemplary embodiment of an optoelectronic semiconductor component described here is explained in greater detail. The optoelectronic semiconductor component comprises an optoelectronic semiconductor chip 100 as described in conjunction with FIG. 3A, for example. The optoelectronic semiconductor chip 100 comprises a radiation exit surface 11 having six vertices. Furthermore, the semiconductor chip 100 comprises at its top surface 1 two triangular connection areas 13a, 13b arranged in the vertices of the parallelogram-shaped top surface 1.

The entire radiation exit surface 11 of the optoelectronic semiconductor chip 100 is covered by the conversion element 3. The conversion element 3 is embodied in a rectangular fashion and projects in small regions beyond the side surfaces 100c of the optoelectronic semiconductor chip and thus beyond the radiation exit surface. The conversion element 3 is free of cutouts or recesses through which contact can be made with the connection areas. Therefore, the conversion element 3 is an unstructured, rectangular conversion element.

In conjunction with the exemplary embodiment in FIG. 4B, an optoelectronic semiconductor component comprising two optoelectronic semiconductor chips 100 is shown, wherein the radiation exit surfaces 11 are in each case embodied in a pentagonal fashion. Each optoelectronic semiconductor chip 100 comprises a single triangular connection area 13a, which together with the pentagonal radiation exit surface 11 forms the top surface 1 of the assigned optoelectronic semiconductor chip.

A single, rectangular conversion element 3 completely covers the two semiconductor chips 100 at their radiation exit surfaces. For each of the optoelectronic semiconductor chips, there is a small region of the conversion element 3 in which the conversion element 3 projects beyond the side surface 100c of the respective semiconductor chip 100. In this case, the optoelectronic semiconductor chips are embodied as described in conjunction with FIG. 3B.

In conjunction with FIG. 5, a further exemplary embodiment of an optoelectronic semiconductor component described here is shown. In this exemplary embodiment, the optoelectronic semiconductor component comprises two optoelectronic semiconductor chips 100 as described in conjunction with FIG. 3A. That is to say that each semiconductor chip 100 comprises a top surface 1 composed of a hexagonal radiation exit surface 11 and two triangular connection areas 13a, 13b. The two semiconductor chips are arranged adjacent to one another at their side surfaces 100a and are covered by a single rectangular conversion element 3. Such an optoelectronic semiconductor component makes it possible to form a particularly large luminous area formed by the top side of the conversion element 3 facing away from the semiconductor chips 100.

FIGS. 6A, 6B, 6C show, with the aid of schematic plan views, optoelectronic semiconductor components wherein the optoelectronic semiconductor chip 100 does not have a triangular connection area, but a rectangular conversion element 3 is used. In each case at least one rectangular connection area 130 is present in the examples shown.

In the case of the example in FIG. 6A there are large regions in which the conversion element 3 projects beyond the radiation exit surface 11. These regions of the conversion element 3 can, moreover, no longer be sufficiently illuminated by light guiding, and so this solution is uneconomic.

In the case of the example in FIG. 6B, a rectangular connection area 130 extends along the entire length of the semiconductor chip. Here it is indeed possible to use a rectangular conversion element 3 that covers the entire radiation exit surface 11. However, a large region of the top surface of the semiconductor chip is covered by the rectangular connection area 130, and so this solution is also uneconomic since the radiation exit surface 11 has to be chosen to be relatively small in relation to the area of the connection area 130.

In the example in FIG. 6C, a similar problem arises for an arrangement of rectangular connection areas 130 at the shorter side of the top surface. Here, too, the area of the radiation exit surface is reduced to an excessively great extent.

The invention is not restricted to the exemplary embodiments by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor component comprising:
    an optoelectronic semiconductor chip; and
    a conversion element arranged at a radiation exit surface of the optoelectronic semiconductor chip,
    wherein the conversion element is rectangular,
    wherein the conversion element completely covers the radiation exit surface,
    wherein the optoelectronic semiconductor chip comprises a non-rectangular, parallelogram-shaped top surface and an active zone, which is at a distance from the top surface and runs parallel to the top surface at least in places,
    wherein the top surface comprises the radiation exit surface, through which electromagnetic radiation generated during operation in the active zone emerges,
    wherein the radiation exit surface has at least four vertices,
    wherein the top surface comprises at least one triangular connection area via which the active zone is electrically connectable,
    wherein the at least one triangular connection area directly adjoins the radiation exit surface, and wherein the at least one triangular connection area directly adjoins a rim of the optoelectronic semiconductor chip.

2. The optoelectronic semiconductor component according to claim 1, wherein the conversion element comprises a rectangular lamella or a rectangular foil.

3. An optoelectronic semiconductor chip comprising:
    a non-rectangular, parallelogram-shaped top surface; and
    an active zone, which is at a distance from the top surface and runs parallel to the top surface at least in places,
    wherein the top surface comprises a radiation exit surface, through which electromagnetic radiation generated during operation in the active zone emerges,
    wherein the radiation exit surface has at least four vertices,
    wherein the top surface comprises a triangular connection area via which the active zone is electrically connectable,
    wherein the triangular connection area directly adjoins the radiation exit surface, and wherein the triangular connection area directly adjoins a rim of the optoelectronic semiconductor chip.

4. The optoelectronic semiconductor chip according to claim 3, wherein the top surface comprises exactly one radiation exit surface and exactly two triangular connection areas, that are arranged at mutually opposite sides of the top surface, wherein the radiation exit surface is arranged between the two triangular connection areas.

5. The optoelectronic semiconductor chip according to claim 3, wherein the radiation exit surface is rectangular.

6. The optoelectronic semiconductor chip according to claim 3, wherein the radiation exit surface has six vertices.

7. The optoelectronic semiconductor chip according to claim 3, wherein the optoelectronic semiconductor chip comprises a plated-through hole that penetrates through the active zone, wherein the plated-through hole is electrically conductively connected to the triangular connection area.

8. The optoelectronic semiconductor chip according to claim 3, wherein the top surface exclusively comprises the radiation exit surface and the triangular connection area or a plurality of triangular connection areas.

9. The optoelectronic semiconductor chip according to claim 3, wherein the triangular connection area is wire-bondable.

10. An optoelectronic semiconductor component comprising:
the optoelectronic semiconductor chip according to claim 3; and
a conversion element arranged at the radiation exit surface of the optoelectronic semiconductor chip, wherein the conversion element is rectangular, and wherein the conversion element completely covers the radiation exit surface.

11. The optoelectronic semiconductor component according to claim 10, wherein the conversion element projects beyond a side surface of the optoelectronic semiconductor chip in places.

12. The optoelectronic semiconductor component according to claim 10, wherein the conversion element completely covers radiation exit surfaces of a plurality of optoelectronic semiconductor chips.

13. The optoelectronic semiconductor component according to claim 10,
wherein the optoelectronic semiconductor component comprises two optoelectronic semiconductor chips, each having exactly one triangular connection area,
wherein the two optoelectronic semiconductor chips adjoin one another at their side surfaces respectively facing away from the triangular connection areas, and
wherein the conversion element completely covers radiation exit surfaces of both optoelectronic semiconductor chips.

14. The optoelectronic semiconductor component according to claim 10, wherein the electromagnetic radiation emerging through the radiation exit surface during operation is at least partly wavelength-converted by the conversion element.

15. The optoelectronic semiconductor component according to claim 10, wherein the conversion element comprises a rectangular lamella or a rectangular foil.

16. An optoelectronic semiconductor chip comprising:
a non-rectangular, parallelogram-shaped top surface; and
an active zone, which is at a distance from the top surface and runs parallel to the top surface at least in places,
wherein the top surface comprises a radiation exit surface, through which electromagnetic radiation generated during operation in the active zone emerges,
wherein the radiation exit surface has at least four vertices,
wherein the top surface comprises exactly two triangular connection areas via which the active zone is electrically connectable,
wherein the top surface comprises exactly one radiation exit surface,
wherein the radiation exit surface and the two triangular connection areas are arranged at mutually opposite sides of the top surface,
wherein the radiation exit surface is arranged between the two triangular connection areas,
wherein the two triangular connection areas each directly adjoins the radiation exit surface, and wherein the two triangular connection areas each directly adjoins a rim of the optoelectronic semiconductor chip.

* * * * *